United States Patent

Cleveland

[11] Patent Number: 5,859,796
[45] Date of Patent: Jan. 12, 1999

[54] PROGRAMMING OF MEMORY CELLS USING CONNECTED FLOATING GATE ANALOG REFERENCE CELL

[75] Inventor: Lee Cleveland, Santa Clara, Calif.

[73] Assignee: Advanced Micro Devices, Inc., Sunnyvale, Calif.

[21] Appl. No.: 991,466

[22] Filed: Dec. 16, 1997

[51] Int. Cl.[6] .................................................. G11C 16/06
[52] U.S. Cl. ................................ 365/185.2; 365/185.22; 365/185.1
[58] Field of Search .......................... 365/185.2, 185.22, 365/185.21, 185.1, 189.07, 210, 185.28, 185.24

[56] References Cited

U.S. PATENT DOCUMENTS

| | | | |
|---|---|---|---|
| 5,172,338 | 12/1992 | Mehrotra et al. | 365/185 |
| 5,293,560 | 3/1994 | Harari | 365/185 |
| 5,528,546 | 6/1996 | Chao et al. | 365/185.21 |
| 5,579,274 | 11/1996 | Van Buskirk et al. | 365/185.22 |
| 5,629,892 | 5/1997 | Tang | 365/185.2 |
| 5,684,741 | 11/1997 | Talreja | 365/185.22 |

*Primary Examiner*—Son Mai
*Attorney, Agent, or Firm*—Jefferson Perkins; Foley & Lardner

[57] ABSTRACT

A reference cell (114) has a "floating gate" (116) that is tied to a voltage reference (118) in emulation of a programmed cell. An associated programming method is used which compares the voltage of a node (112) associated with the cell (114) with the voltage on a similar node (108) associated with a selected cell (12) in the array; the array cell (12) is determined to be sufficiently programmed when a predetermined relationship is obtained between these two nodes. In this manner, a separate verify mode is avoided.

11 Claims, 3 Drawing Sheets

PROGRAMMING OF MEMORY CELLS USING CONNECTED FLOATING GATE ANALOG REFERENCE CELL

TECHNICAL FIELD OF THE INVENTION

The present invention relates in general to electrically programmable read-only memory arrays, and more particularly to an analog reference cell for such arrays for which a separate VERIFY operational mode is avoided.

BACKGROUND OF THE INVENTION

In conventional electrically programmable read-only memory (EPROM) cells, and more particularly electrically erasable and programmable read-only memory (EEPROM) cells, a "verify" operation is required to be performed after every programming operation in order to assure that the selected cell has been effectively programmed. A typical program/verify scheme is shown in the electrical circuit diagram of FIG. 1. A memory array indicated by the dashed enclosure 10 includes a plurality of memory cells 12,14 arranged in rows and columns. Each row of cells is connected by a corresponding word line $WL_0$–WL. Each cell is also a member of a bit line (one bit line 15 is shown) to which the drain 16 of every cell in the bit line is connected. The bit line is selected by a bit line tree decoder including transistors 18, 20 and 22; these are actuated, respectively, by signals YD2, YD1 and SEC.

In programming a cell, a programming voltage $V_{PP}$, which for example may be 10 volts, is supplied through a row decoder or multiplexer 24 to a selected one of the word lines $WL_0$–WL. Meanwhile, a programming drain voltage $V_{PROG}$ is applied through a p-channel field effect transistor 26 and serially through the current paths of decoding transistors 18–22 to a drain 16 of the selected cell.

For each particular sector or other predetermined group of memory cells 12–14, a reference cell 28 is provided in order to determine whether or not a particular cell within the array 10 has been programmed. While a selected one of the cells 12–14 within the array 10 is being programmed, the reference cell 28 is also being programmed. For this purpose, a p-channel transistor 30 and pseudo tree decoder transistors 32, 34 and 36 are provided in order to apply $V_{PROG}$ to the drain of the reference cell 28, in emulation of the application of $V_{PROG}$ to the selected cell within the array 10. The programming voltage $V_{PP}$ is applied through a row decoder analog circuit 38 to the control gate 40 of the reference cell 28. After the application of a full programming pulse of magnitude $V_{PP}$ for a predetermined period of time, the programming voltages are disconnected from the circuit, as by making the PROG signal low, and a pair of verify voltage sources $V_{VC}$ and $V_{VG}$ are connected to the circuit, as by means of making a signal VERIFY go high. The "verify" voltage $V_{VG}$ to be applied to the control gate of the inspected cell is chosen as about 5 volts in the illustrated embodiment. A "verify" voltage $V_{VD}$, for application to the drain of the selected cell, is applied when the VERIFY signal is high to the drain of the selected cell through decoding transistors 18–22. In the illustrated scheme, the source is grounded in both PROGRAM and VERIFY states.

To determine whether a selected cell has been appropriately programmed according to the prior art, the voltage at a node 42, which is coupled to the drain of the selected cell by the decoder transistors 18–22, is compared with the voltage present at a node 44, which in turn is coupled to the drain of the reference cell 28 through the current paths of decoder-emulating transistors 32–36. The voltages at nodes 42 and 44 are compared by a sense amplifier 46. As a selected cell becomes more and more programmed, its threshold voltage $V_t$ will grow and its drain to source current $I_{DS}$ will drop. The smaller the $I_{DS}$ current, the smaller the voltage drop that will be experienced at node 42. Hence, when the node 42 has a voltage which is less than the voltage drop at node 44, a programmed state will be declared by the sense amplifier 46 and the next cell will then be addressed.

According to this conventional practice, "verify" voltages are applied to the reference cell 28 each time a verification is performed on one of the cells in the memory array 10. Thus, the number of times that the reference cell 28 is accessed is several orders of magnitude greater than the number of times that any particular cell inside the memory array 10 is accessed. The reference cell 28 is generally programmed only once, while cells within the array 10 have a tendency to be programmed and refreshed, or programmed, erased and reprogrammed, several times. Therefore, as time passes, the danger increases that the reference cell 28 will begin to lose its programming, causing an increase in its $I_{DS}$ and a decrease in the voltage drop across the cell. When the voltage drop at mode 44 is compared in the verify state with the voltage at node 42 caused by the inspected cell in the array, the sense amplifier 46 may "pass" the cell as being programmed, while in actuality an insufficient amount of programming has occurred to the selected cell.

Another problem with a conventional program/verify sequence is that, typically a program pulse of a predetermined magnitude and period is applied to the memory cell each time programming is called for, regardless of the relative amount of programming to the floating gate of the cell needed. This creates the danger of overprogramming, because fractions of a programming pulse are unable to be applied to the cell. The overprogramming of selected cells in the array leads to a wider program $V_t$ distribution which in turn results in a wider erase $V_t$ distribution, limiting endurance; overprogramming also degrades the long term performance of the EEPROM cell.

Finally, the conventional method necessitates a separate VERIFY state having voltages different from the programming state. The VERIFY state takes time to enter into and exit from, thereby slowing down the programming process.

A need therefore exists for a programming method and apparatus that permits a variable programming pulse to be applied to the floating gate of the cell to be programmed and which avoids a separate VERIFY state.

SUMMARY OF THE INVENTION

The present invention meets these needs by providing a method for determining when an electrically programmable memory cell, such as an EEPROM cell, selected from an array of such cells, has been programmed, without the method requiring a separate verify state. A reference cell is provided which is substantially similar in its structure to any of a plurality of cells in the memory array. A floating gate analog of the reference cell is connected to a voltage reference, and the value of the voltage reference is preselected so that the floating gate analog emulates a floating gate of the selected cell as it would exist in a programmed condition. A predetermined structural component of the reference cell, such as the drain thereof, is connected to a first input of a voltage comparator. A like structural component of the selected memory cell is connected to a second input of the comparator. The comparator, such as a sense amplifier, will indicate that the selected cell is programmed when the voltage on the second input of the voltage comparator has a value which is as least as large as the voltage appearing on the first input of the voltage comparator.

Because a value related to the drain to source current ($I_{DS}$) of the selected memory cell as being continuously compared to a like value associated with the $I_{DS}$ of the reference cell, a programming pulse of varying length may be applied to the selected memory cell until the conductance of the selected memory cell falls below a predetermined point. This obviates the danger of overprogramming by the iterative all-or-nothing application of full program pulses per the prior art. The present invention confers technical advantages in that the memory array will have tighter $V_t$ programming and erase distributions and in that the reference cell will not be subject to premature degradation.

BRIEF DESCRIPTION OF THE DRAWINGS

Further aspects of the invention and their advantages will be discerned with reference to the following drawings in which like characters identify like parts and in which.

DETAILED DESCRIPTION OF THE INVENTION

Figure 1:
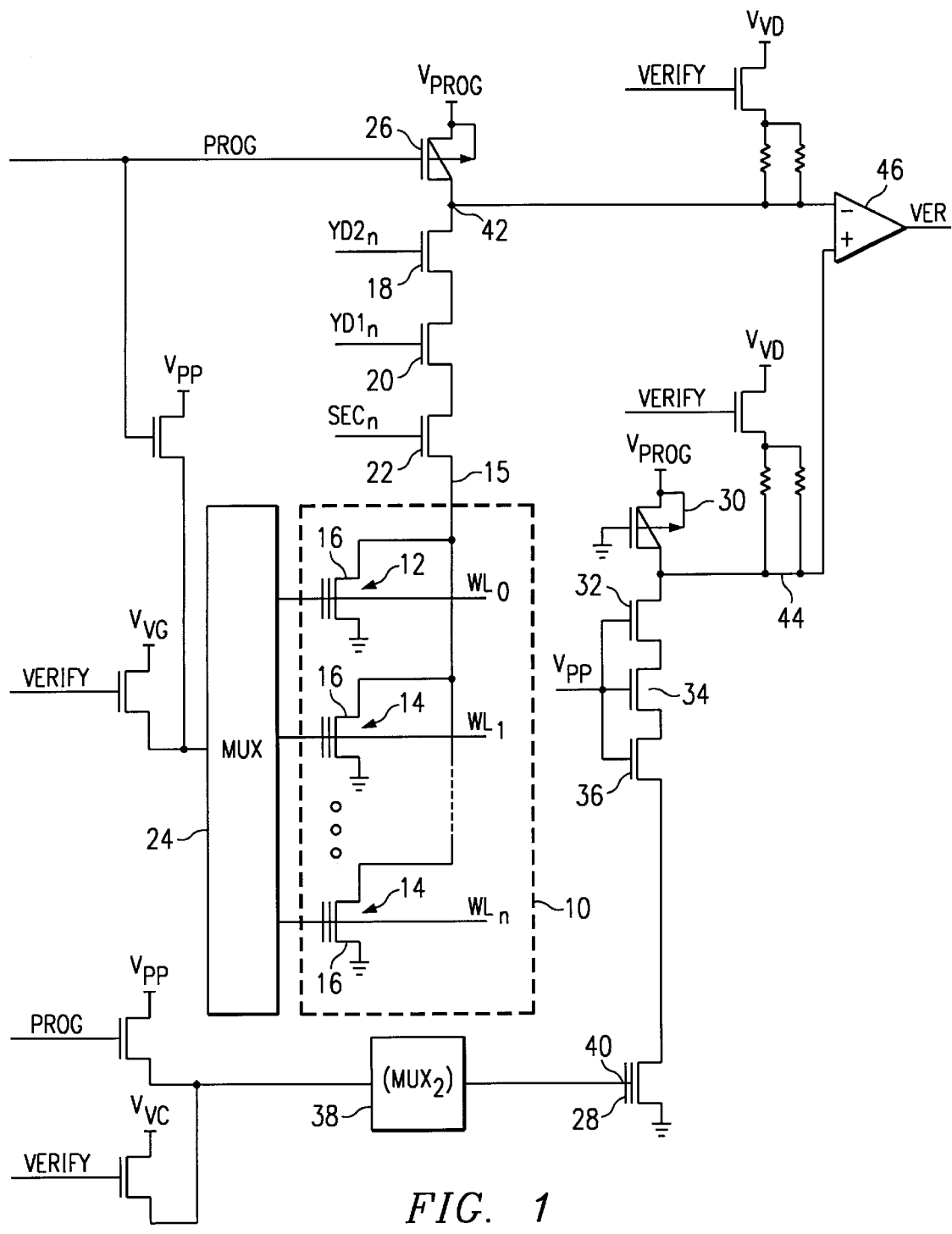
FIG. 1 is an electrical schematic circuit diagram of a programming and verification circuit according to the prior art.
Figure 2:
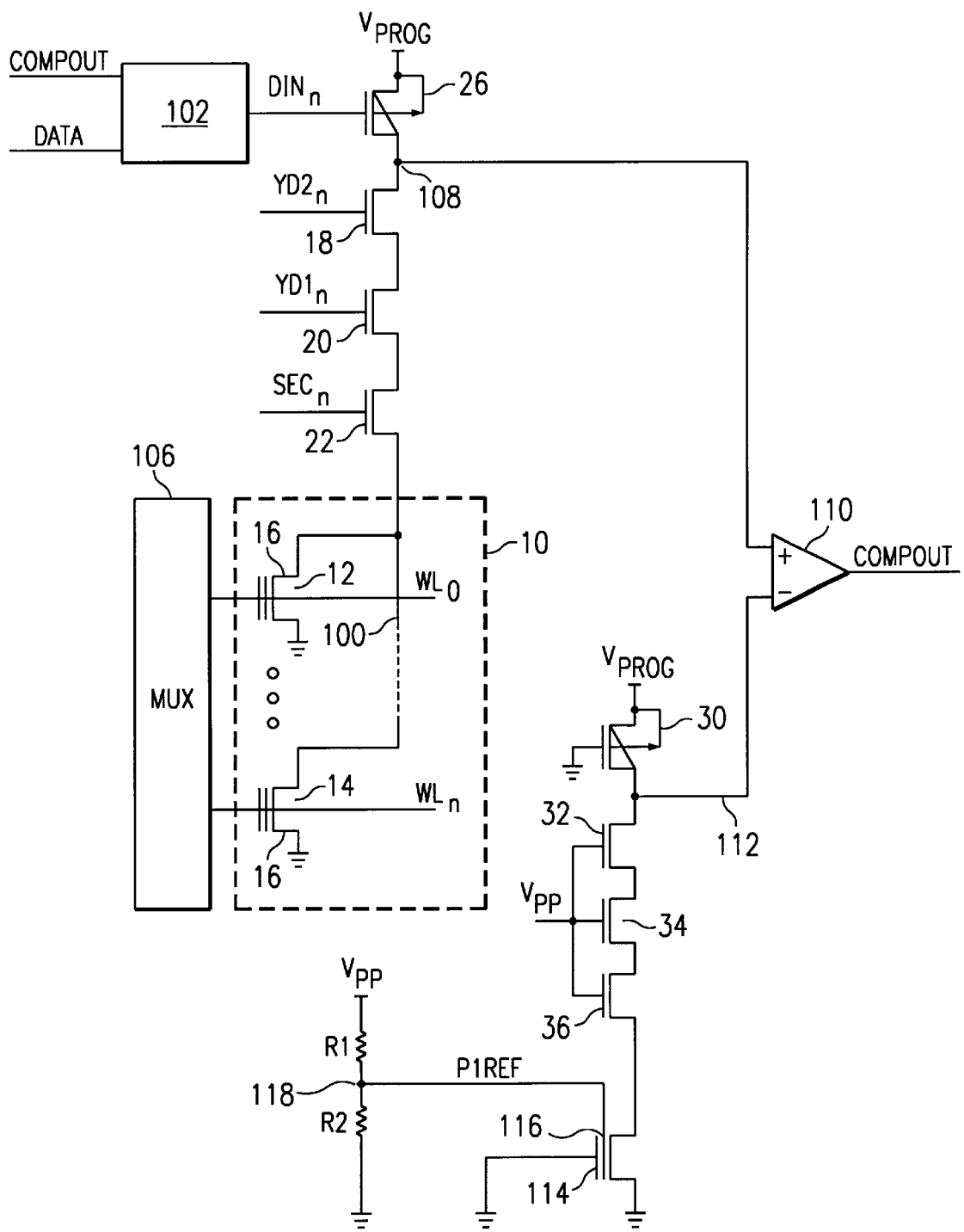
FIG. 2 is an electrical schematic diagram of a simultaneous program and verify circuit according to the invention.

FIG. 2 is an electrical circuit diagram of a programming circuit according to the invention and is analogous to FIG. 1. Like characters identify like parts between the two figures. The electrical schematic diagram shown in FIG. 2 has been simplified in order to bring out the salient features of the invention. Transistors 18, 20 and 22 are representative of a tree decoder which decodes a selected bit line 100 in the EEPROM array 10. A DIN signal is output from a data buffer 102 and controls the conductance of a p-channel transistor 26. When the bit line 100 is selected, the signal $V_{PROG}$ will be passed by transistors 26, 18, 20 and 22 to the drain 16 of each memory cell on the bit line 100 (only two cells shown at 12 and 14). A programming voltage source $V_{PP}$ is applied through a word line decoder or multiplexer 106 to a selected one of the word line $WL_0 \ldots WL$, thus selecting a particular cell to be programmed in the array 10. The drain programming voltage $V_{PROG}$ will be passed to the bit line 100 only when both the bit of data (DATA) and a COMPOUT signal are low; otherwise no programming of the selected cell will take place.

The voltage at a node 108 is input into a first input of a sense amplifier 110. A second input of the sense amplifier 110 is connected to a node 112. A current path of a p-channel transistor 30, which is the analog of p-channel transistor 26, connects the node 112 to the drain programming voltage source $V_{PROG}$. Node 112 is connected via analog tree decoder transistors 32, 34 and 36 to a drain of an analog reference cell 114. While programming is being carried on, the control gate programming voltage $V_{PP}$ is applied to the gates of each of transistors 32, 34 and 36. The gate of the p-channel transistor 30 is connected to ground, keeping this transistor on at all times.

The structural characteristics of the reference cell 114 are made to be as identical as possible to those of the memory array cells 12,14, with the important exception that a floating gate analog 116 of the reference cell 114 is connected to a node 118; unlike the floating gates of the EEPROM cells in the array 10, gate 116 does not "float" at all. A voltage divider is formed by resistors $R_1$ and $R_2$, and the gate programming voltage $V_{PP}$ is applied to this voltage divider. The voltage divider resistor values are selected such that the voltage appearing on the "floating" gate analog 116 will be same as the voltage appearing on the floating gate of a completely programmed cell within the array 10. In this way, the conductance characteristics of the reference cell 114 will emulate those of a fully programmed cell. Since the drain to source current IDS going through cell 114 will be relatively small when the cell 114 is programmed, the voltage drop at node 112 will be relatively small as well.

The sense amplifier 110 continuously compares the voltage at node 112 with the voltage at node 108. As programming continues, the difference between node 112 and node 108 will be less and less as the drain to source current sorts through the current path of the selected memory cell (say, cell 12) becomes less and less. Finally, the voltage at node 108 will rise to the point where it crosses the voltage experienced at node 112, and in response the output amplifier 110 will cause its output signal COMPOUT to go high.

The COMPOUT signal is fed back to the data buffer 102. A high state of COMPOUT will drive DIN high, shutting off the p-channel transistor 26 and disconnecting the programming voltage $V_{PROG}$ from the current path of the selected memory cell. In like fashion, COMPOUT can be used to selectively gate the programming voltage $V_{PP}$ (not shown).

The present invention confers a principal technical advantage in that a variable programming pulse may be applied to each particular cell in the array 10, and the duration of this pulse is automatically determined to be that which is sufficient to program the cell 12. As programmed using this method, the cells in the array 10 will have a more uniform $V_t$ distribution. Further, because the programming pulse is terminated if and only if the selected cell has been sufficiently programmed, a separate verify operation is unnecessary and the programming operation is speeded up commensurately. Finally, because the floating gate 116 of the reference memory cell 114 is permanently tied to a voltage which emulates that of a programmed cell, premature degradation of the reference cell because of a high number of access operations to the memory reference cell is obviated.

Figure 3:
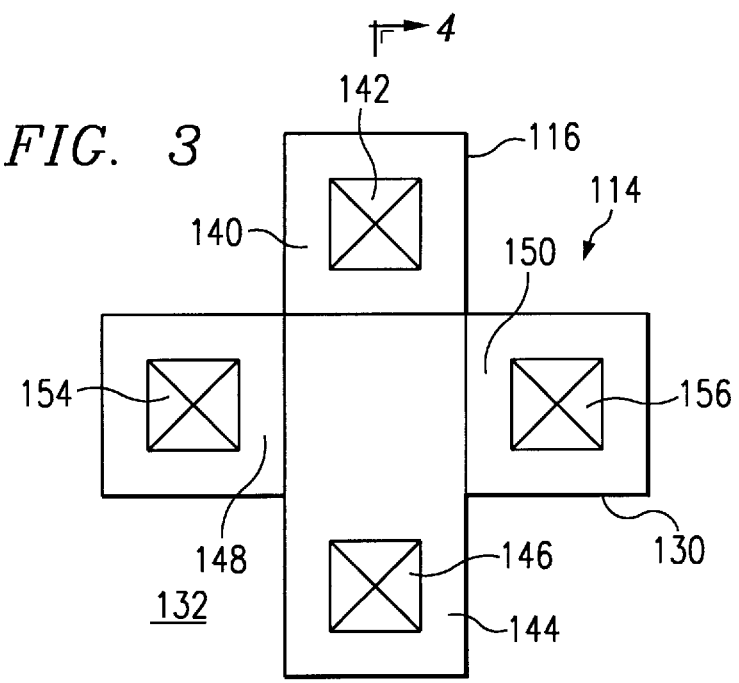
FIG. 3 is a highly magnified schematic plan view of a connected floating gate analog reference cell according to the invention.
Figure 4:
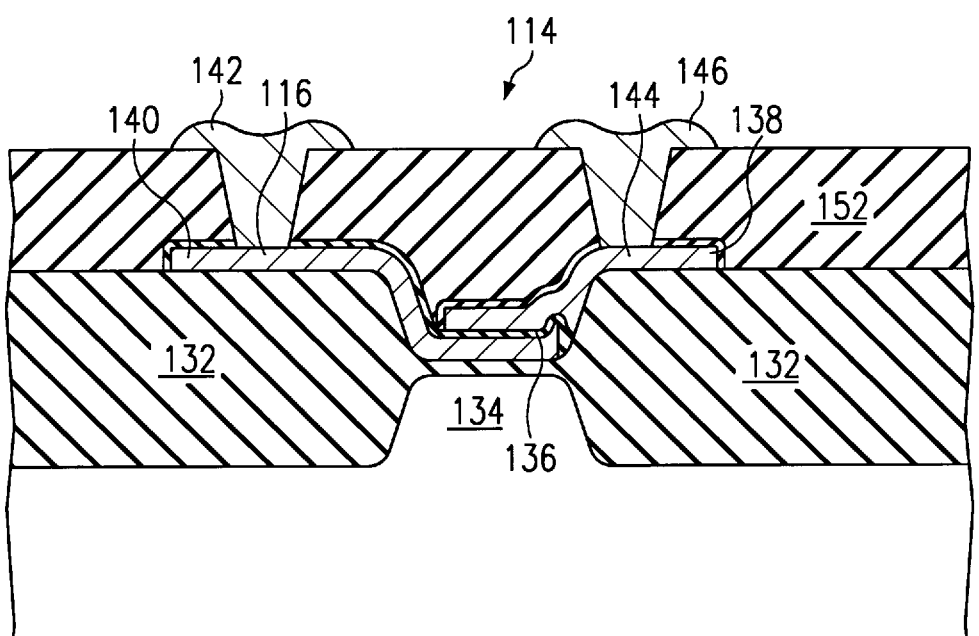
FIG. 4 is a sectional view taken substantially along line 4—4 of FIG. 3.

FIGS. 3 and 4 are schematic and highly magnified plan and sectional views of one possible cell design for a connected "floating gate" analog reference cell 114. Per conventional practice, the reference cell 114 may be formed in an active device area 130 that is delimited by LOCOS regions 132. In alternative embodiments (not shown), active device area 130 may be isolated instead by shallow trenches, and (p+) channel stop implants may be employed. After appropriate $V_t$ adjusts and punch through implants are performed to the active device area 130, as including the future channel region 134, a first layer of polycrystalline silicon (POLY1) is deposited, patterned and etched to create a "floating" gate 116. After the deposition of an interlevel oxide 136, a second level of poly (POLY2) is deposited, patterned and etched to create a control gate 138. An extension 140 of the "floating" gate may be brought out onto LOCOS island 132 for connection via a contact 142 to node 118 (FIG. 2). An extension 144 of the control gate 138 may be brought out onto the oxide island 132 in an opposite direction and connected to a ground source through a contact 146. The "floating" gate 116 and the control gate 138 may be used to self-align a source/drain implant that creates a source 148 and a drain 150 prior to depositing a passivating oxide 152 and opening the contacts 142 and 146. A source contact 154 and a drain contact 156 are formed to connect to the source 148 and the drain 150, respectively, to complete the structure.

In summary, a novel analog reference cell and array cell programming method and apparatus have been shown and described that obviate the need for a separate "verify" mode, reduce the range of $V_t$ values within an array of programmed cells, and preserve the reference cell from the problems associated with repeated access operations to same. While the embodiments of the present invention have been described in the above detailed description and illustrated in the accompanying drawings, the invention is not limited thereto but only by the scope and spirit of the appended claims.

What is claimed is:

1. Apparatus for determining when a selected electrically programmable memory cell in an array of such cells has been programmed, comprising:

a reference cell having structural characteristics which are substantially similar to said selected cell;

a floating gate analog of said reference cell coupled to a voltage reference, the value of said voltage reference preselected to cause said analog to emulate a floating gate of said selected cell as it would exist in a programmed condition;

a voltage comparator having first and second inputs, circuitry for coupling a predetermined structural component of said reference cell to said first input of said voltage comparator;

circuitry for coupling a structural component corresponding of the selected cell to said structural component of said reference cell to said second input of said voltage comparator; and an output of the voltage comparator for indicating that the selected cell is programmed responsive to the voltage on said second input of said voltage comparator having a value at least as large as the voltage appearing on said first input of said voltage comparator.

2. The apparatus of claim 1, wherein said predetermined structural component of said reference cell and said structural component of said selected cell are drains.

3. An electrically erasable and programmable (EEPROM) memory, comprising:

an array of memory cells, each cell in said array having a floating gate and a second predetermined structural component;

a reference cell having a floating gate analog and a second predetermined structural component, said second predetermined structural component and said floating gate analog of said reference cell being respectively similar in structure to the second predetermined structural components and floating gates of said cells in said array;

a voltage reference connected to said floating gate analog, the value of said voltage reference preselected to emulate a floating gate of a cell in said array as it would exist in a programmed condition; and a voltage comparator, a first input of said voltage comparator selectively coupled to said second predetermined structural component of a selected cell to be programmed in said array, a second input of said voltage comparator coupled to said second predetermined structural component of said reference cell, an output of said voltage comparator declaring said selected cell as programmed when the voltage on said first input is in a predetermined relationship with the voltage on said second input of said comparator.

4. The memory of claim 3, wherein said predetermined relationship is substantial equality.

5. The memory of claim 3, wherein the second predetermined structural component of said selected cell to be programmed is coupled to said first input by current paths of a plurality of decoding transistors, the current paths of a like plurality of pass transistors coupling said second predetermined structural component of said reference cell to said second input of said voltage comparator.

6. The memory of claim 3, wherein each cell in said array of cells is formed at a face of a semiconductor layer having a first conductivity type, each cell further having a source region formed to be of a second conductivity type opposite said first conductivity type, said second predetermined structural component being a drain region of said second conductivity type, a channel region formed in said semiconductor layer to be of said first conductivity type and to space said source region from said drain region, said floating gate insulatively spaced from said channel region and controlling the conductance of said channel region, a control gate of said cell being insulatively spaced from but capacitively coupled to said floating gate; and said reference cell formed at said face, said second predetermined structural component of said reference being a drain region of said second conductivity type, a source region formed at said face in said semiconductor layer to be of said second conductivity type, a channel region of said reference cell formed to be of said first conductivity type and spacing said source region from said drain region, said floating gate analog formed of conductive material to be insulatively spaced from said channel region so as to control the conductance thereof, a conductive connection made to said floating gate analog and coupled to said reference voltage, a control gate insulatively spaced from but capacitively coupled to said floating gate analog.

7. The memory of claim 3, wherein said second predetermined structural component of each said cell in said array and said second predetermined structural component of said reference cell are drains.

8. The memory of claim 3, wherein said memory cells in said array are erasable.

9. A method of programming a selected cell in an array of electrically programmable memory cells, comprising the steps of:

coupling a structural component of a reference cell exhibiting the characteristics of a programmed memory cell to a first input of a voltage comparator;

coupling a like structural component of the selected cell to a second input of a voltage comparator;

beginning the application of a programming voltage to a control gate of the selected cell; and continuing to apply the programming voltage to the control gate of the selected cell until the voltage on the first input is in a predetermined relationship to the voltage appearing on the second input.

10. The method of claim 9, wherein the structural component and the like structural component are drains.

11. The method of claim 9, wherein said method does not include a verify mode during which a verify set of voltages distinct from a programming set of voltages is applied to a reference cell and the selected cell.

* * * * *

UNITED STATES PATENT AND TRADEMARK OFFICE
CERTIFICATE OF CORRECTION

PATENT NO. : 5,859,796
DATED : January 12, 1999
INVENTOR(S) : Cleveland

It is certified that error appears in the above-identified patent and that said Letters Patent is hereby corrected as shown below:

In Column 2, line 23, delete "mode" and insert --node--.
In Column 3, line 2, delete "as least" and insert --at least--.
In Column 3, line 5, delete "as being" and insert --is being--.

In Column 5, line 34-35, delete "corresponding of" and insert --corresponding to--.

Signed and Sealed this

Eighteenth Day of May, 1999

Attest:

Attesting Officer

Q. TODD DICKINSON

Acting Commissioner of Patents and Trademarks